(12) United States Patent
Li

(10) Patent No.: US 8,456,820 B2
(45) Date of Patent: Jun. 4, 2013

(54) ELECTRONIC DEVICE

(75) Inventor: Zhan-Yang Li, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 201 days.

(21) Appl. No.: 13/159,597

(22) Filed: Jun. 14, 2011

(65) Prior Publication Data

US 2012/0134082 A1 May 31, 2012

(30) Foreign Application Priority Data

Nov. 25, 2010 (CN) .......................... 2010 1 0559070

(51) Int. Cl.
*G06F 1/16* (2006.01)
(52) U.S. Cl.
USPC ....... 361/679.02; 385/135; 174/481; 248/315
(58) Field of Classification Search
USPC ................. 385/135, 100, 24; 439/540.1, 658, 439/620.1, 733.1; 343/853, 859; 174/68.3, 174/104, 102 R, 50, 51, 481; 361/679.01, 361/679.02, 679.31, 679.58, 679.32, 679.37, 361/679.33, 679.4, 679.41, 679.22, 679.21, 361/679.6, 679.61, 679.39, 810, 754, 826, 361/821, 796; 248/68.1, 309.1, 74.1, 315, 248/70, 49, 316
See application file for complete search history.

(56) References Cited

U.S. PATENT DOCUMENTS

| | | | |
|---|---|---|---|
| 7,171,099 B2 * | 1/2007 | Barnes et al. ................. | 385/135 |
| 7,499,623 B2 * | 3/2009 | Barnes et al. ................. | 385/135 |
| 8,292,660 B2 * | 10/2012 | Allwood .................... | 439/540.1 |
| 2010/0086267 A1 * | 4/2010 | Cooke et al. ................. | 385/100 |
| 2013/0039629 A1 * | 2/2013 | Krampotich et al. ......... | 385/135 |

* cited by examiner

*Primary Examiner* — Hung Duong
(74) *Attorney, Agent, or Firm* — Altis Law Group, Inc.

(57) ABSTRACT

An electronic device includes a chassis, at least one cable disposed in the chassis, and a cable management member. The cable management member includes a first side plate, a second side plate, and a connecting plate located between lower sides of the first side plate and the second side plate. A cable holding slot is located between the first side plate and the second side plate for holding the at least one cable. A clamp extends from the first side plate. A circular protrusion extends from the second side plate. The circular protrusion is securely engaged with the clamp in a first position where the cable management member is at a natural state to hold the at least one cable, and the circular protrusion is disengaged from the clamp in a second position where the second side plate is resiliently deformed to release the at least one cable.

18 Claims, 3 Drawing Sheets

ELECTRONIC DEVICE

BACKGROUND

1. Technical Field

The present disclosure relates to an electronic device with a cable management member.

2. Description of Related Art

Many electronic devices, such as computers, include a plurality of input and output cables to transfer data. The input and output cables include power cables, data cables, communication lines, keyboard lines, and so on. It is therefore desirable to include some type of cable management device, such as a binding accessory, that allows the various cables to be collected together and attached to a preferred position for improving the appearance of the electric device and saving space in the chassis. However, it is inconvenient to use the binding accessory to hold or release the cables.

Therefore, there is room for improvement within the art.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation. In the figures of the accompanying drawings in which like references indicate similar elements. It should be noted that references to "an" or "one" embodiment in this disclosure are not necessarily to the same embodiment, and such references mean at least one.

Figure 1:
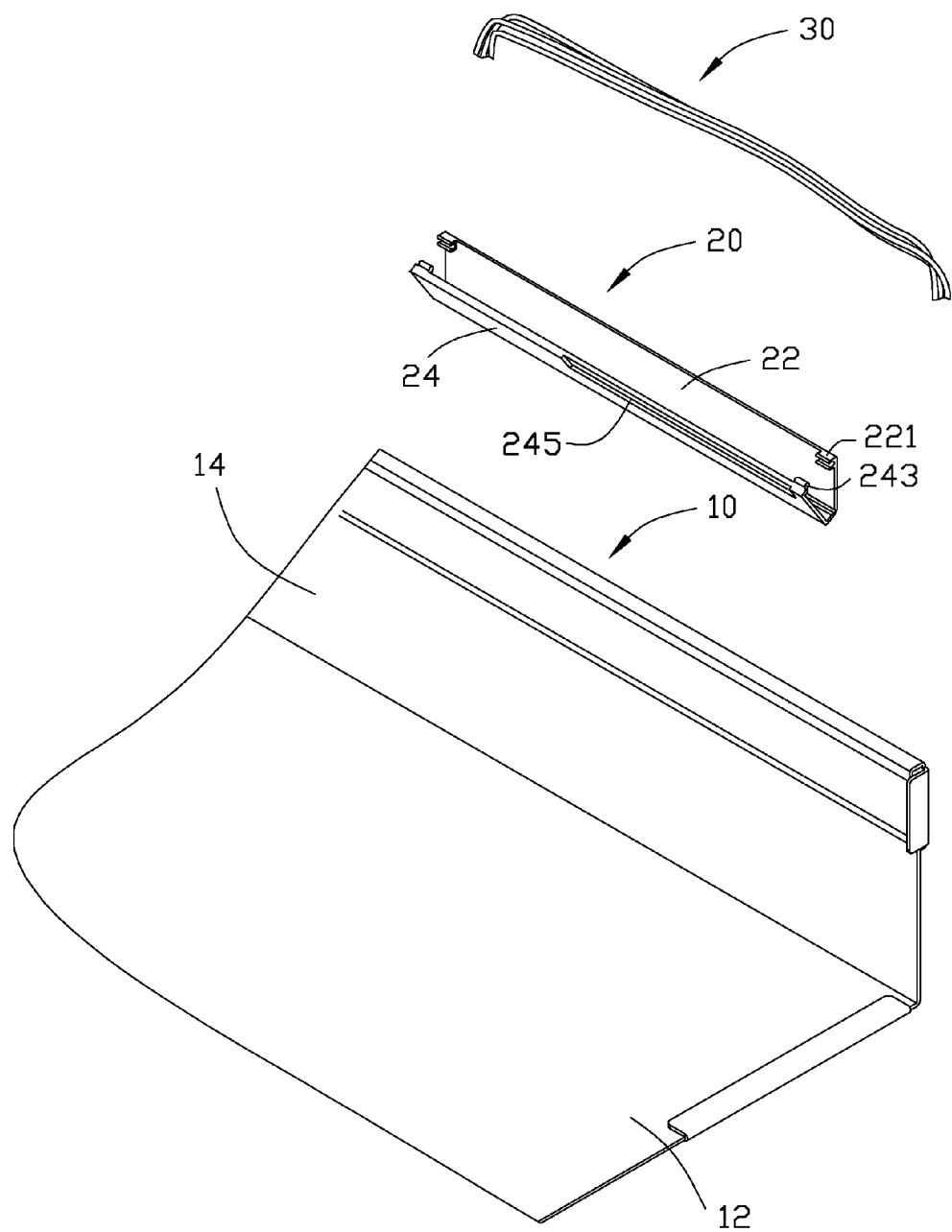
FIG. 1 is an exploded view of an electronic device according to an embodiment; the electronic device includes a cable management member in an unlocked state.

Referring to FIG. 1, an embodiment of an electronic device includes a chassis 10, a cable management member 20, and a plurality of cables 30. The cables 30 can include data cables, power cables etc. The chassis 10 includes a base panel 12 and a side panel 14 perpendicularly connected to the base panel 12. The cable management member 20 can keep the cables 30 organized in the chassis 10.

Figure 2:
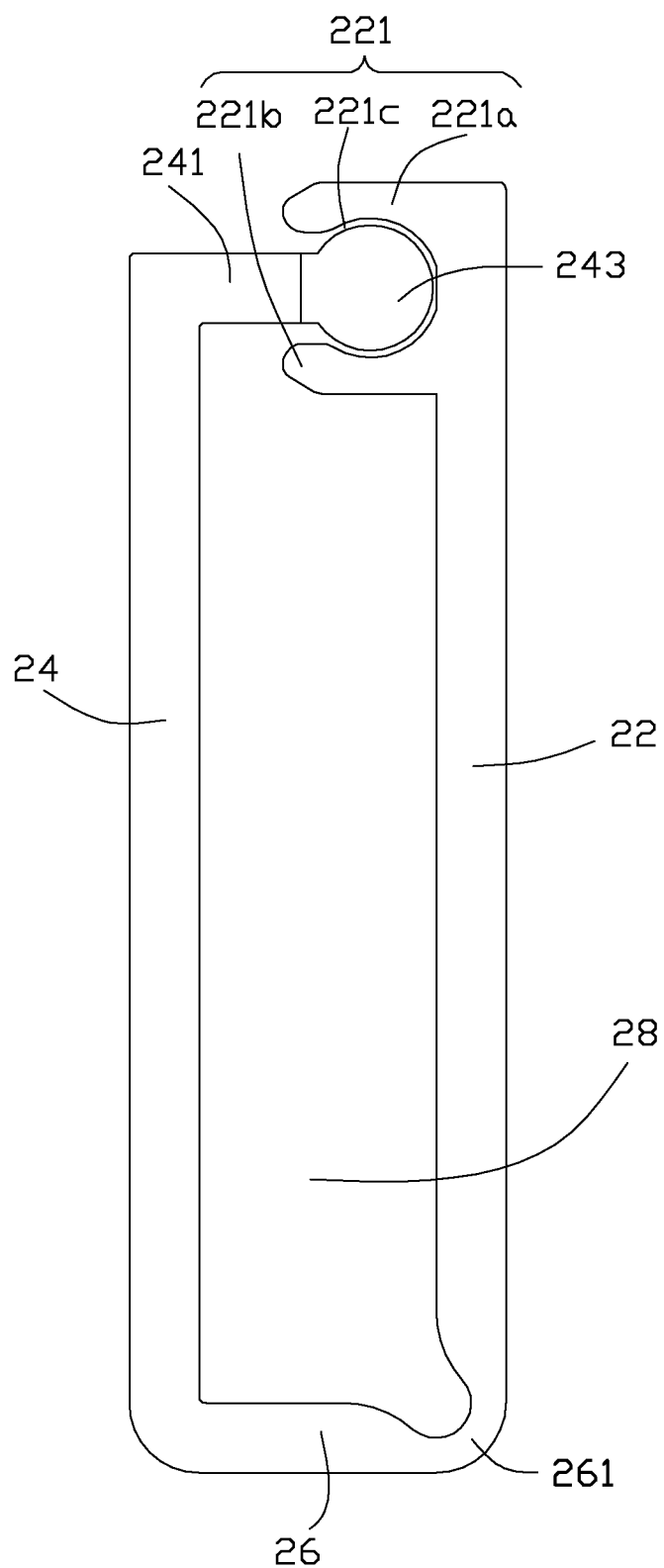
FIG. 2 is a side view of the cable management member of FIG. 1 in a locked state.

FIGS. 1 and 2, the cable management member 20 is integrally formed and made from elastic material, such as metal, plastic, etc. The cable management member 20 includes a first side plate 22, a second side plate 24, and a connecting plate 26. The connecting plate 26 is connected to and located between lower edges of the first side plate 22 and the second side plate 24. A pair of clamps 221 protrudes from two upper corners of the first side plate 22. Each of the pair of clamps 221 includes a first clamp piece 221a, a second clamp piece 221b, and a mounting gap 221c that is located between the first clamp piece 221a and the second clamp piece 221b. The first clamp piece 221a and the second clamp piece 221b are symmetrically located and perpendicularly protrude from an inner side of the first side plate 22 towards the second side plate 24. A top flange 241 perpendicularly extends from a top edge of the second side plate 24. A pair of circular protrusions 243 protrudes from two distal ends of the top flanges 241 towards the first side plate 22. An operation opening 245 is defined in the second side plate 24 for facilitating users to apply pressure to release the second side plate 24 from the first side plate 22. A diameter of each of pair of circular protrusions 243 is greater than a thickness of the top flange 241. When the clamp 221 is at a natural state, a width of an entrance of the mounting gap 221c is less than the diameter of the circular protrusion 243. A junction 261 of the connecting plate 26 and the first side plate 22 is thinner than any other portion of the connecting plate 26 and the first side plate 22. The second side plate 24 and the connecting plate 26 can pivot about the junction 261. When the pair of circular protrusions 243 is engaged with the pair of clamps 221, the first side plate 22 is parallel to the second side plate 24. A cable holding slot 28 is located between the first side plate 22 and the second side plate 24.

Figure 3:
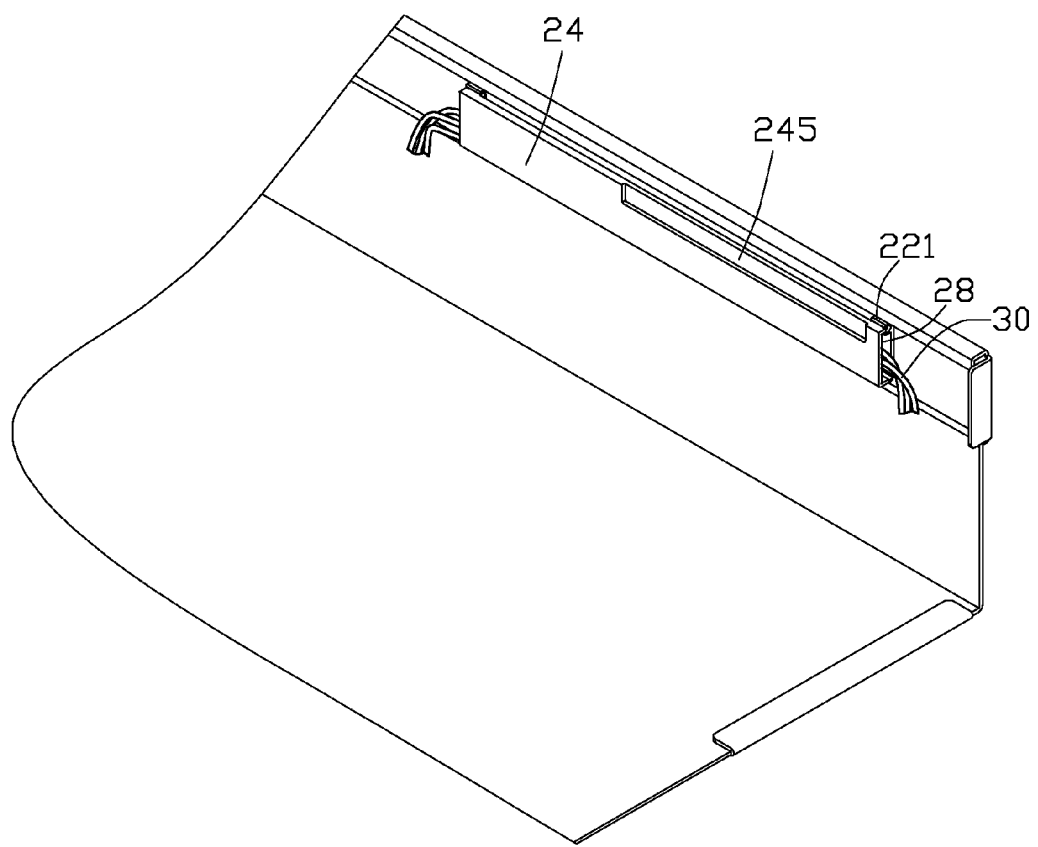
FIG. 3 is an assembled view of the electronic device of FIG. 1.

Referring FIGS. 1 to 3, in assembly, the first side plate 22 is securely attached on an inner surface of the side panel 14. The second side plate 24 is released from the first side plate 22 and located at an oblique angle relative to the first side plate 22 (see FIG. 1). The cables 30 are placed in the cable holding slot 28 via a top opening between the first side plate 22 and the second side plate 24. Then, the second side plate 24 is released. The second side plate 24 and the connecting plate 26 pivot about the junction 261 in a clockwise direction to return to a natural state. The pair of circular protrusions 243 deforms the pair of clamps 221. The entrance of the mounting gap 221c becomes wider, thereby allowing each of the pair of circular protrusions 243 to engage in the mounting gap 221c. Then, the pair of clamps 221 returns to its natural state and holds the pair of circular protrusions 243 in the mounting gaps 221c. The first clamp piece 221a and the second clamp piece 221b clamp the circular protrusion 243 therebetween. Thus, the cables 30 are held by the cable management member 20, which keeps the cables 30 organized in the chassis 10.

To release the cables 30 from the cable management member 20, the second side plate 24 is pulled and rotated to the release position where the pair of circular protrusions 243 is disengaged from the pair of clamps 221. Then the cables 30 can be removed from the cable management member 20.

While the present disclosure has been illustrated by the description of preferred embodiments thereof, and while the preferred embodiments have been described in considerable detail, it is not intended to restrict or in any way limit the scope of the appended claims to such details. Additional advantages and modifications within the spirit and scope of the present disclosure will readily appear to those skilled in the art. Therefore, the present disclosure is not limited to the specific details and illustrative examples shown and described.

What is claimed is:

1. An electronic device comprising:

a chassis; and a cable management member, attached to the chassis, comprising a first side plate, a second side plate, and a connecting plate located between the first side plate and the second side plate; the connecting plate is connected to a first lengthways edge of each of the first side plate and the second side plate; a cable holding slot is located between the first side plate and the second side plate; and a clamp extending from the first side plate, and a circular protrusion extending from the second side plate;

wherein the circular protrusion is securely engaged with the clamp in a first position, where the second side plate is locked to the first side plate, and the circular protrusion is disengaged from the clamp in a second position, where the second side plate is rotated to release from the first side plate.

2. The electronic device of claim 1, wherein the clamp comprises a first clamp piece, a second clamp piece, and a mounting gap located between the first clamp piece and the second clamp piece; and the circular protrusion is engaged in the mounting gap and clamped by the first clamp piece and the second clamp piece in the first position.

3. The electronic device of claim 2, wherein the first clamp piece and the second clamp piece extends perpendicularly from an inner side of the first side plate and are adjacent to a second lengthways edge of the first side plate.

4. The electronic device of claim 2, wherein a flange extends substantially perpendicular from a second lengthways edge of the second side plate, and the circular protrusion extends from the flange.

5. The electronic device of claim 4, wherein a diameter of the circular protrusion is greater than a thickness of the flange.

6. The electronic device of claim 5, wherein a width of an entrance of the mounting gap is less than the diameter of the circular protrusion when the clamp is in a natural state.

7. The electronic device of claim 1, wherein a conjunction between the connecting plate and the first side plate is thinner than any other portion of the connecting plate and the first side plate, and the second side plate and the connecting plate are pivotable about the conjunction.

8. The electronic device of claim 1, wherein the first side plate is secured on an inner surface of the chassis; the first side plate is parallel to the second side plate in the first position, and the second side plate is at an oblique angle relative to the first side plate in the second position.

9. The electronic device of claim 1, wherein the cable management member is integrally formed and made from elastic rigid material.

10. An electronic device comprising:
a chassis; and
a cable management member comprising a first side plate, a second side plate, and a connecting plate located between lower sides of the first side plate and the second side plate; a cable holding slot located between the first side plate and the second side plate for holding the at least one cable; and at least one clamp extending from the first side plate, and at least one circular protrusion extending from the second side plate corresponding to the at least one clamp;
wherein the at least one circular protrusion is securely engaged with the at least one clamp in a first position where the cable management member is in a natural state, and the at least one circular protrusion is disengaged from the at least one clamp in a second position where the second side plate is resiliently deformed.

11. The electronic device of claim 10, wherein the at least one clamp comprises a first clamp piece, a second clamp piece, and a mounting gap located between the first clamp piece and the second clamp piece; and the at least one circular protrusion is engaged in the mounting gap and clamped by the first clamp piece and the second clamp piece in the first position.

12. The electronic device of claim 11, wherein the first clamp piece and the second clamp piece extends perpendicularly from an inner side of the first side plate and are located at an upper side of the first side plate.

13. The electronic device of claim 12, wherein a flange extends substantially perpendicular from an upper edge of the second side plate, and the at least one circular protrusion extends from the flange.

14. The electronic device of claim 13, wherein a diameter of the at least one circular protrusion is greater than a thickness of the flange.

15. The electronic device of claim 14, wherein a width of an entrance of the mounting gap is less than the diameter of the at least one circular protrusion when the at least one clamp is in the natural state.

16. The electronic device of claim 10, wherein a conjunction between the connecting plate and the first side plate is thinner than any other portion of the connecting plate and the first side plate, and the second side plate and the connecting plate are pivotable about the conjunction.

17. The electronic device of claim 10, wherein the first side plate is secured on an inner surface of the chassis; the first side plate is parallel to the second side plate in the first position, and the second side plate is at an oblique angle relative to the first side plate in the second position.

18. The electronic device of claim 10, wherein the cable management member is integrally formed and made from elastic rigid material.

* * * * *